United States Patent [19]
Waskiewicz

[11] Patent Number: 5,663,568
[45] Date of Patent: Sep. 2, 1997

[54] APPARATUS FOR CONTROLLING A CHARGED PARTICLE BEAM AND A LITHOGRAPHIC PROCESS IN WHICH THE APPARATUS IS USED

[75] Inventor: Warren Kazmir Waskiewicz, Clinton, N.J.

[73] Assignee: Lucent Technologies Inc., Murray Hill, N.J.

[21] Appl. No.: 546,078

[22] Filed: Oct. 20, 1995

[51] Int. Cl.$^6$ ................................................ H01J 37/304
[52] U.S. Cl. .................. 250/492.2; 250/398; 250/346 R
[58] Field of Search ................................ 250/492.2, 398, 250/396 R, 396 ML, 310

[56] References Cited

U.S. PATENT DOCUMENTS

| | | | |
|---|---|---|---|
| 3,715,582 | 2/1973 | Akahori et al. | 250/49.5 |
| 4,362,942 | 12/1982 | Yasuda | 250/492.2 |
| 4,400,622 | 8/1983 | Takeuchi et al. | 250/396 ML |
| 4,468,565 | 8/1984 | Blair et al. | 250/491.1 |
| 4,825,033 | 4/1989 | Beasley | 250/396 ML |
| 4,871,912 | 10/1989 | Kokubo et al. | 250/311 |
| 4,973,849 | 11/1990 | Nakamura et al. | 250/492.2 |
| 5,258,246 | 11/1993 | Berger et al. | 430/4 |
| 5,288,567 | 2/1994 | Sakamoto et al. | 250/492.2 |
| 5,311,026 | 5/1994 | Saitou et al. | 250/492.2 |

FOREIGN PATENT DOCUMENTS

| | | |
|---|---|---|
| 56-45025 | 4/1981 | Japan . |
| 2-82612 | 3/1990 | Japan . |

OTHER PUBLICATIONS

"Electron–Optical Design for the Scalpel Proof–of–Concept Tool," Waskiewicz et al.

*Primary Examiner*—Kiet T. Nugyen
*Attorney, Agent, or Firm*—Richard J. Botos

[57] ABSTRACT

An apparatus and process in which a particle beam is used to introduce a pattern into an energy sensitive material is disclosed. A coil assembly is used to selectively control both the orientation of the particle beam relative to the substrate on which the energy sensitive material is applied and the magnification or demagnification of the image in the particle beam. The coil assembly comprises at least two coils. The particle beam is projected through the coil assembly. The coil assembly is used to rotate the particle beam to compensate for an observed difference between the actual substrate orientation and the desired substrate orientation. The coils in the coil assembly are excited so that the desired rotation is introduced into the particle beam by the cumulative effects of the magnetic fields generated by the excited coils in the coil assembly. The coils in the coil assembly are calibrated such that the desired amount of beam rotation is provided by the coil assembly without introducing unwanted lens effects into the beam. The coils are also used to introduce a desired lens effect, such as magnification of demagnification, into the particle beam without introducing unwanted rotation into the beam. In another embodiment, the coils are used to introduce a desired lens effect, such as magnification or demagnification, into the particle beam without introducing unwanted rotation into the beam.

16 Claims, 4 Drawing Sheets

APPARATUS FOR CONTROLLING A CHARGED PARTICLE BEAM AND A LITHOGRAPHIC PROCESS IN WHICH THE APPARATUS IS USED

BACKGROUND OF THE INVENTION

1. Technical Field

The present invention is directed to systems that use charged particle beams to draw or write patterns directly onto substrates such as, for example, semiconductor wafers coated with an energy sensitive material.

2. Art Background

In processes that use a charged particle beam to draw or write patterns on substrates, the orientation of the beam relative to the orientation of the substrate is important to ensure not only that the desired pattern is introduced into the substrate, but that each point of the pattern is oriented properly relative to the other points in the pattern being drawn or written and to existing patterns already formed in the substrate. Typically, alignment marks are placed on the substrate, and the beam is directed to write the pattern relative to the alignment marks. The substrate is placed on a mechanically movable stage that adjusts the position of the substrate relative to the beam. The beam is targeted by detecting the alignment marks, and moving the mechanical stage so that the substrate and the beam coincide at the desired point.

Referring to FIG. 1, as noted in U.S. Pat. No. 5,811,026 to Saitou et al., if the orientation flat 21 of the wafer 11 is rotated relative to the stage orientation, which is represented by the directional arrows x and y, then typically the wafer is rotated to properly align the arrangement of the patterns illustrated as chips 24 relative to the image carried by the charged particle beam. The wafer is typically rotated by rotating a mechanical stage on which the wafer is placed. The position of the wafer is adjusted by detecting the orientation of the marks 22 and 28 and making the necessary adjustment by rotating the substrate to obtain the proper orientation of the beam relative to the rotation marks. Saitou et al. proposes that the mechanical stage only be used for translational movement of the wafer (i.e. movement in the x, y and z directions) and that a lens or coil be used to rotate the particle beam in relation to the wafer rather than vice-versa. Saitou et al. notes that it is advantageous to rotate the shaped particle beam itself, because, if the orientation flat 21 is rotated by an angle $\theta$ relative to the moving direction of the mechanical stage, the line drawn by the beam tends to be stepwise, as illustrated in FIG. 2. As noted by Saitou et al., $\theta$ should be less than 1 mrad in order to avoid adverse lithographic consequences from the stepwise pattern illustrated in FIG. 2.

Because it is difficult to obtain mechanical prealignment with this degree of precision, Saitou et al. suggests using a rotating lens (e.g. a solenoid coil) to actually rotate the beam relative to the wafer. Saitou et al. notes that this solution is limited because the solenoid coil also introduces magnification or demagnification effects into the beam. Saitou et al. observes that the amount of rotation provided by the coil is limited to the amount that can be provided with substantially almost no beam blurring. Since, in many instances, greater rotation than what can be provided without negligible magnification change is needed, such a restriction provides design constraints on the coil which make it unadaptable to a variety of process conditions. Since a mechanism for rotating a particle beam which adapts to different process conditions is desired, a different solution other than the one proposed by Saitou et al. is sought.

SUMMARY OF THE INVENTION

The present invention is directed to an apparatus that utilizes a plurality of solenoid coils to control the orientation and magnification of a charged particle beam. It is advantageous if the apparatus is used in a charged particle beam lithography system. Electrons and ions are examples of charged particles. In a preferred embodiment, the charged particles are electrons.

In the apparatus, an assembly of solenoid coils is used to effect a desired change in a beam of charged particle. Typically, that change is either in the orientation of the beam relative to the wafer (referred to herein as rotation), the magnification (or demagnification) of the image conveyed by the beam, or both the orientation and magnification of the beam. However, it is contemplated that the coil assembly will be used to introduce a variety of other lens effects into a charged particle beam in addition to the specifically mentioned change in magnification or demagnification. The coil assembly affects the orientation of the beam relative to the wafer by generating a magnetic field that rotates the particle beam as it passes through the coil assembly. That same magnetic field also magnifies or demagnifies the image in the beam. The magnetic field provided by each individual coil in the coil assembly is related to the number of turns (N) in the coil and the excitation current (I) provided to the coil.

The coil assembly utilizes a plurality of coils to effect the desired change or changes in the particle beam because a plurality of coils provide the ability to introduce the desired effects into the beam and to subtract the undesired effects from the beam that are introduced by the field of a particular coil in the coil assembly. For example, as noted by Saitou et al., if one coil is used to rotate the beam, the amount of rotation is limited to that which can be accomplished without introducing what is described herein as a "lens effect." A lens effect is either a change in the magnification of the image transmitted by the beam, a change in the focus location of the beam, or increased aberrations in the image transmitted by the beam. If one coil is used to rotate the beam, the lens effect caused by the rotation is unchecked. However, if a plurality of coils are used, the effects of the magnetic fields generated by each individual coil are controllable, such that the desired effects can be introduced into the beam and the undesired effects introduced by the field from one coil can be subtracted out by the other coil. Although, in a preferred embodiment of the invention, the coil assembly is used both to rotate the particle beam transmitted through the coil assembly to a desired degree and to introduce a desired lens effect into the beam, the invention is first described in terms of an embodiment in which the coil assembly is used to rotate the particle beam without attendant lens effects and an embodiment in which the coil assembly is used to introduce a desired lens effect into the particle beam without rotating the beam to a significant degree.

Although the invention is described herein in terms of a plurality of coils, one skilled in the art will appreciate that the objective is to utilize a plurality of magnetic fields to effect the desired change in the particle beam. Consequently, one skilled in the art will appreciate that a plurality of solenoid coils, a plurality offenses, or a combination of solenoid coils and lenses can be used to practice the present invention. In the context of the present invention, a lens is a coil inside a shell that confines and shapes the magnetic field. The shell is used to confine and shape the magnetic field generated by the coil inside the shell.

The apparatus also includes a particle beam generator and at least one filter for the particle beam. Such particle beam filters take the form of shaping apertures (an object that deflects or reflects the particle beam with a hole therein through which the particle beam passes) or masks such as scatter-nonscatter masks (a surface with one portion through which the particle beam passes without being significantly scattered and another portion that significantly scatters or deflects the particle beam) and stencil masks. The coils are placed between the shaping aperture or mask and the imaging plane of the particle beam (the plane in which the particle beam image is focused). The apparatus optionally contains other optics such as a shaping lens or other equivalent optics. These optics are used for purposes such as focusing the image in the particle beam.

The apparatus optionally includes a stage on which is placed a wafer. The apparatus focuses the image in the particle beam onto the surface of the wafer, over which is placed a layer of energy sensitive material. The image in the beam is transferred into the energy sensitive material on the wafer. Typically, the stage on which the wafer is placed is movable so that the translational position of the wafer relative to the beam is adjustable. Just how coarse or fine this adjustment is depends upon design parameters. The apparatus is also equipped with a mechanism for detecting the position of the wafer and a feedback mechanism for adjusting the beam shape and trajectory based upon the position of the wafer.

In one embodiment of the present invention, the solenoids are used to rotate the beam when the substrate is observed to be rotated an angle θ from its desired position in the x–y plane of the wafer. The apparatus is equipped with a mechanism that detects the position of the wafer by reading the position of the alignment marks on the surface of the substrate. The position of these alignment marks is detected either optically or by using the charged particle beam. The detector then determines the degree to which the beam should be rotated based upon the position of the wafer and provides the requisite amount of current to the solenoid coil assembly to effect the desired rotation. Because the coil assembly contains a plurality of coils, and each coil has an associated magnetic field that is related to the physical characteristics of the coil and the current provided to the coil, the magnetic field of each coil is manipulated so that the the beam is rotated to the desired degree by the coil assembly, and only desired lens effects (e.g. a desired change in the amount of image magnification) are introduced into the beam. The magnetic fields of the individual coils are manipulated so that any undesired effects introduced by the field from one coil are subtracted from the beam by the magnetic field of the other coil or coils.

DETAILED DESCRIPTION

Figure 1:
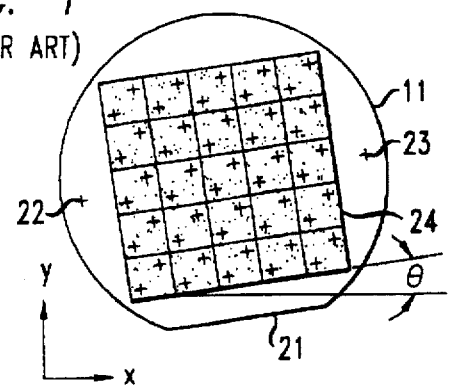
FIG. 1 is a diagram indicating a relationship between the substrate and the X and Y directions of stage movement.
Figure 2:
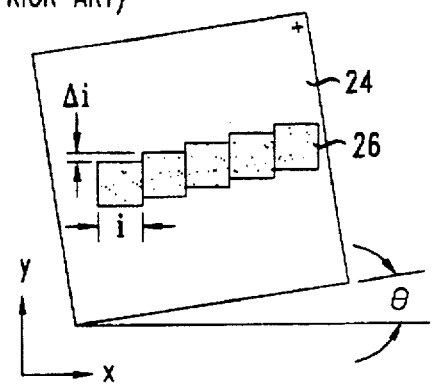
FIG. 2 is a diagram indicating position errors due to the directional difference between the shaped beam and the beam deflection, when the amount of rotational misalignment (θ) of the substrate is great.

The present invention is directed to an apparatus and process that utilizes a plurality of solenoid coils to rotate a beam of charged particles. Each solenoid coil generates a magnetic field when electrical current is passed therethrough. The field so generated depends upon the physical characteristics of the coil and the amount of current provided to the coil. The magnetic field affects the particle beam in several ways. Typically, the magnetic field will rotate the particle beam and also introduce some lens effects into the beam. These lens effects take the form of changes in the magnification or demagnification of the image in the beam. At least two coils are required because typically, the magnetic field generated by one coil cannot be used to introduce the desired effect into a particle beam without also introducing undesired effects into the beam. For example, using a coil to rotate a beam of charged particles also introduces lens effects into the beam. Similarly, using a coil to introduce a desired lens effect into a charged particle beam also rotates the beam. Since only in limited circumstances will a single coil generate a magnetic field that provides both the desired amount of rotation and the desired lens effect, a plurality of coils are used to introduce the desired effects into the beam and to subtract the undesired effects introduced by a particular coil from the beam. Therefore, if the coil assembly is used to effect a desired change in the charged particle beam, the magnetic fields generated by the assembly are manipulated to provide the desired change to the beam (e.g. rotation) without introducing undesired effects into the beam. "Undesired effects" in the context of the present invention are effects which result in significant and adverse lithographic consequences.

Solenoid coils generate a magnetic field when electric current is transmitted through the windings of the coil When the particle beam passes through a coil with current passing therethrough, the particle beam is affected by the field generated by the coil. The degree to which the particle beam is affected by the coil depends upon the magnetic field generated by the coil. The magnetic field generated by the coil is affected in turn by the coil features. Coils are provided in many shapes such as torroidal, cylindrical and saddle shapes. Because of the physical constraints imposed by the apparatus in which the coils are incorporated, the coils in the apparatus of the present invention are typically cylindrical. The characteristic dimensions of the cylindrical coil are the bore and the height of the coil. The height of the coil is directly related to the number of wire windings that make up the coil. The number of windings, the coil height and the coil inner bore all affect the field generated by the coil. One skilled in the art is able to select a particular configuration if provided with the physical constraints on coil placement (i.e. the dimensions of the area in the apparatus in which the coils are to be placed) and the magnitude of magnetic field that the coil should generate. One skilled in the art will appreciate that the coils can be incorporated into the charged particle beam apparatus in the form of a lens, which is a coil inside a shell that confines and shapes the magnetic field generated by the coil. In such lenses the field generated by the coil is dependent on coil configuration and on shell configuration. One skilled in the art is familiar with how to manipulate the shell (typically referred to as pole pieces) of such lenses to achieve the desired effect on the field generated by the coil inside the shell.

The location of the coils relative to each other is also a matter of design choice. For example, the coils can be arranged sequentially or in a nested manner, (e.g. one coil with a smaller bore placed within a second coil with a larger bore).

Since the effect of the magnetic field generated by the coil is a function of coil configuration (i.e. both coil location and coil features), coils with the same configuration generate a similar magnetic field. Since the advantages of the present invention flow from using a plurality of different magnetic fields to effect the particle beam in a desired way, a coil assembly having a plurality of coils with different coil configurations is contemplated.

Figure 3:
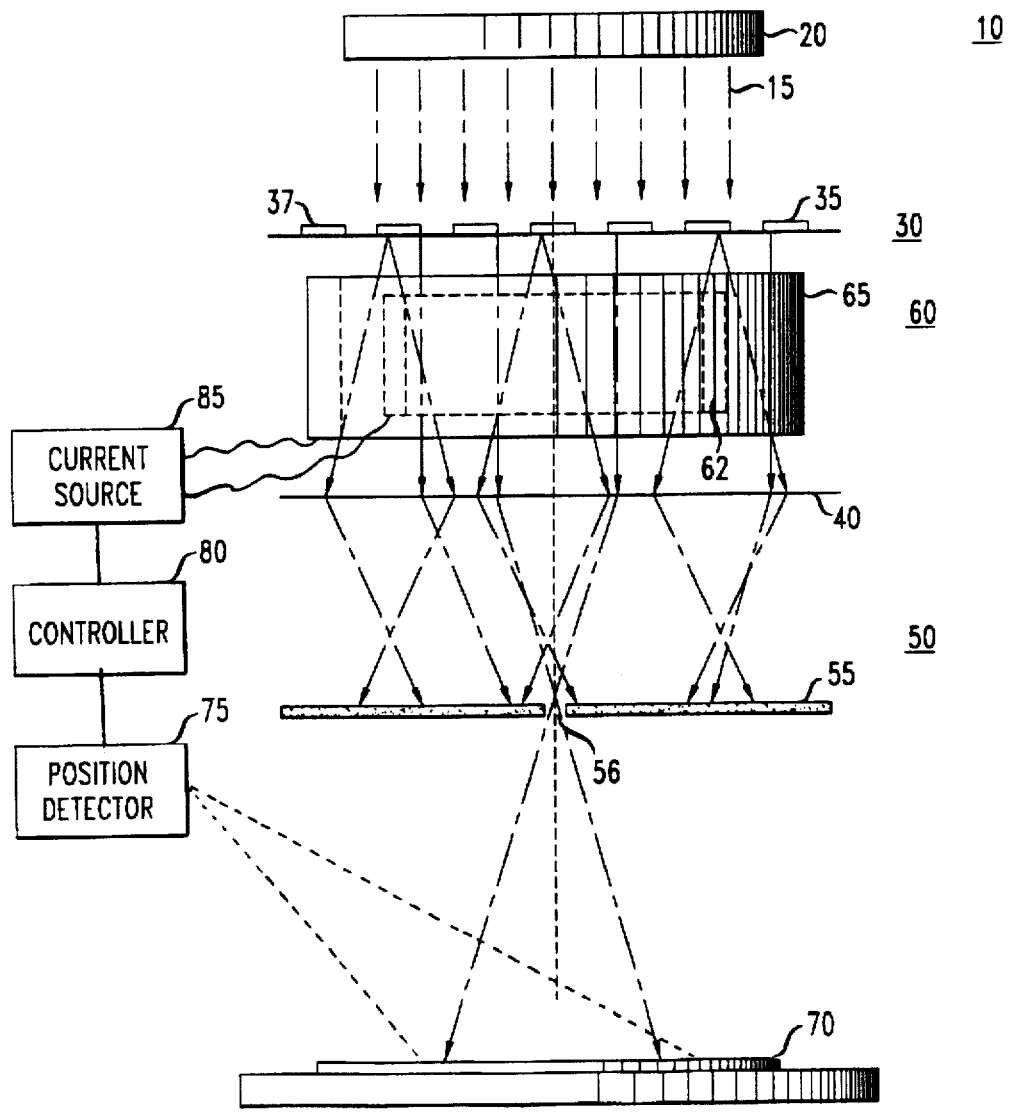
FIG. 3 is a schematic of an embodiment of the present invention.

In one embodiment of the invention, the plurality of solenoid coils is placed in an electron beam lithography system. A schematic of one embodiment of the present invention is illustrated in FIG. 3. In this embodiment, the coil assembly has two coils, one with a smaller diameter bore nested in a second coil with a larger diameter bore. However, the plurality of coils of the present invention are susceptible of being adapted into any charged particle apparatus wherein the functions performed by the plurality of coils is desired.

In the apparatus 10 illustrated in FIG. 3, an electron beam 15 is emitted by a particle source generator 20, e.g. an electron gun. The particle beam 15 is projected onto a mask 30. The mask consists of a first portion 35, which significantly scatters electrons transmitted therethrough and a second portion 37 which does not scatter electrons as much as the first portion. The mask 30 patterns the electron beam transmitted therethrough. The mask is not described in detail herein but is described fully in U.S. Pat. No. 5,258,246 to Berger et al., which is hereby incorporated by reference.

The electron beam is then projected through coil assembly 60. In coil assembly 60, coil 62 is nested within coil 65. The apparatus 10 is provided with a wafer rotation angle detector (75) which is used to determine the degree to which the wafer 70 is rotated relative to the desired orientation of the wafer 70. If the detector 75 determines that the wafer is rotated, the detector transmits the degree of rotation to a controller. The controller 80 is programmed with sufficient information for it to determine how much current to provide to the coils 62 and 65 to rotate the beam 15 to adjust to the rotation of the wafer 70 without introducing undesired lens effects into the image conveyed by the beam. If the image in the electron beam requires a certain change in the amount of magnification or demagnification, then the controller 80 determines the amount of current to provide to the coils in the lens assembly to provide the desired amount of rotation and magnification or demagnification. The controller 80 controls the amount of current provided to the coils 62 and 65 from current source 85.

After the beam passes through the coil assembly 60, it projects onto a lens 40 which alters the trajectory of the electron beam. The electron beam emerging from the lens 40 is made incident on a back focal plane filter 50. The electron beam that emerges from the back focal plane filter 50 through aperture 56 is then transmitted onto wafer 70.

In the embodiment illustrated in FIG. 3, the coil assembly 60 is placed between the mask 30 and the back focal plane filter 50. However, the placement of the coils in the apparatus is largely a matter of design choice. However, the coils must be placed either between the mask 30 and the first subsequent imaging plane (the back focal plane filter 50 is placed in the imaging plane) or between the back focal plane filter 50 and the first subsequent imaging plane (the wafer 70 is placed in the subsequent imaging plane). As long as all the coils necessary to achieve a desired effect are placed somewhere between a mask and an imaging plane, or a shaping aperture (such as a back focal plane filter) and an imaging plane, no other constraints on their placement are required to ensure that they perform their desired function.

Figure 4:
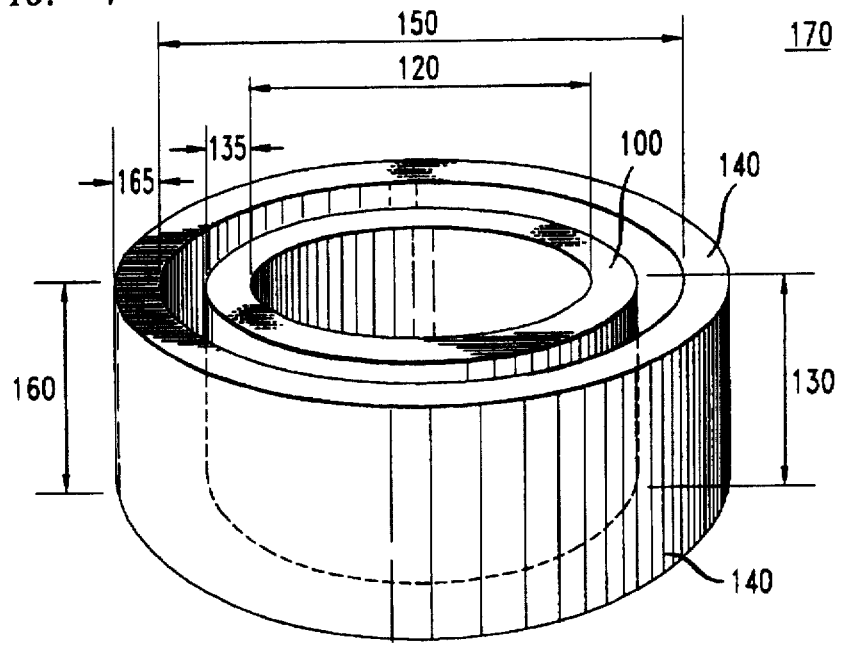
FIG. 4 is a detail view of the solenoid component of FIG. 3.

The coil assembly 60 in the apparatus 10 depicted in FIG. 3 is shown in detail in FIG. 4. As illustrated in FIG. 4, the inner coil 100 has an inner diameter or bore 120, a height 130, and a width 135. The outer coil 140 also has a bore 150, a height 160, and a width 165. For convenience, the inner coil is referred to as coil A and the outer coil 140 is referred to as coil B. Although the coils 100 and 140 are depicted as having the same height, this is not a design requirement. The coil bores, 120 and 150, coil heights, 130 and 160, and coil widths, 135 and 165, are all selected to meet the spatial constraints of the particle beam exposure tool in which they are placed, and to meet the desired performance criteria.

Once the coils are placed in the particle beam apparatus, the coils are calibrated to determine their effect on the particle beam rotation and magnification. As one skilled in the art will appreciate, this calibration is accomplished in a number of different ways. For example, a wafer with alignment marks and an energy sensitive material placed thereover is placed in an electron beam exposure apparatus such as the one described above. The wafer is exposed to the radiation, and the orientation and size of the resulting image is determined. One of the coils is then excited by providing a measured mount of current to the coil. The wafer is then subjected to a second exposure. The effect of the coil on the rotation and magnification of the image is observed. This process is repeated using a number of different increments of current to determine the relationship between coil excitation and image rotation and magnification for the particular coil. After repeating this process a number of times, a relationship between coil excitation, image rotation and image magnification for a particular coil is determined. This process is then repeated for the second coil. If more than two coils are present in the tool, then the process is repeated for each of the coils.

EXAMPLE 1

The following is one example of how two coils are used to control both the rotation and magnification of a particle beam. The purpose of this example is to illustrate the interdependence of rotation and magnification. Based upon this information, one skilled in the art can adapt a plurality of coils to control the rotation and magnification of a particle beam.

The effect of a dual coil assembly on the magnification and rotation of a particle beam was modeled using particle beam modeling software that was obtained from Munro's Electron Beam Software Ltd. of London, England. The modeling was based on the insertion of two coils into the projection system optics for a SCALPEL-based lithography tool that is disclosed in Waskewicz, W., et al. "Electron-Optical Design for the SCALPEL™ Proof-of-Concept Tool," *Proceedings of the SPIE*, Vol. 2522 (1995) which is hereby incorporated by reference. The software package MLENSC was used to calculate the axial flux density provided by a particular coil design, where the design parameters were current density in the coil windings, coil bore, coil width, and coil height. The calculated axial flux densities, as well as the axial flux densities calculated for the various elements for the projection system optics, were then used in a second software package called MAGOPT. This second program was used to determine the effect of coil locations and coil excitation levels on the imaging characteristics of the projection system optics. In this manner, image rotation and image magnification adjustments caused by the coils were examined.

Figure 5:
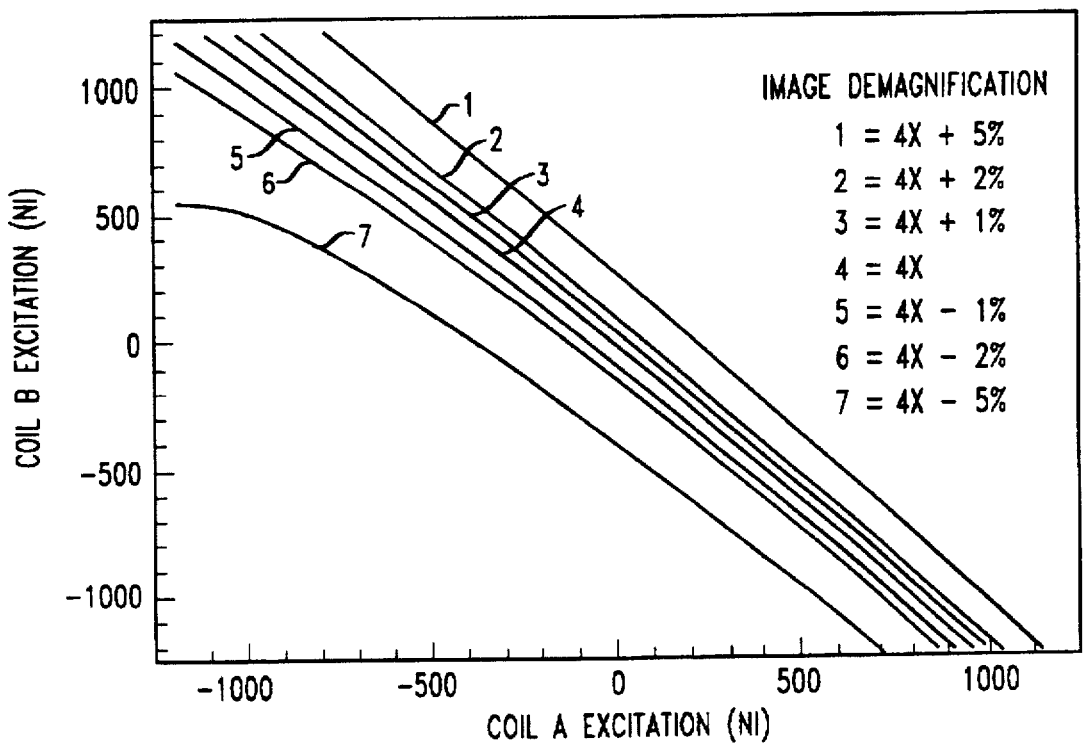
FIG. 5 illustrates the relationship between the excitation of two coils in a coil assembly for a coil assembly that provides constant magnification.

The interdependence between image rotation and magnification, and the adjustability of image rotation and magnification, was calculated for the nested coil assembly depicted in FIG. 4. The following parameters were provided to describe the system modeled by the software. Coil A and cot B each had a width of 5 mm and a height of 24 mm. The bores for coil A and coil B were 100 mm and 170 mm, respectively. The distance of the coil assembly after the object plane was set at 75 mm. The object to image plane distance was set at 400 mm. The projection system lens parameters were selected so as to achieve a demagnification factor of 4. As illustrated in FIG. 5, for a given excitation level (the product of N (number of windings) and I (current) ), the apparatus can adjust the image magnification to be either more or less than the nominal image demagnification provided by the projection system optics alone.

In FIG. 5, since the modeling data was obtained for a tool that provided 4X demagnification (i.e. the image was 0.25 the size of the object) the amount of demagnification is expressed as a percent of the demagnification available from the tool. In this regard, the 4X labeled curve 4 represents the set of coil excitation conditions which do not change the nominal magnification of the image in the particle beam. Similarly, "4X±1%," etc. indicates the amount by which the image demagnification has been affected by the coil assembly. FIG. 5 demonstrates that, for a constant value of magnification or demagnification of the image in the electron beam (i.e. along any one of the iso-magnification contours in FIG. 5) there is a specific relationship between the excitation levels set in each of the coils in the nested assembly. Similarly, there is a specific relationship between the excitation levels set in each of the coils that provides constant rotation.

Consequently, the coil assembly can be used to adjust one of either the image rotation or (de)magnification while holding the other parameter constant. As demonstrated by FIG. 6, image magnification is held constant over a certain range of rotation angles. From FIGS. 5 and 6, it is observed that a controller provided with the information illustrated in FIGS. 5 and 6 could effect beam rotation within a certain range by providing the appropriate excitation to the coils to keep the magnification constant, yet effect the desired amount of rotation. For example, if the apparatus observed from the alignment marks on the wafer that the beam must be rotated two degrees, and the demagnification provided by the coils is desired to be zero percent (indicated by the 4X demagnification line in FIG. 6), the controller would provide the appropriate amount of excitation to the coils to achieve that result.

Figure 6:
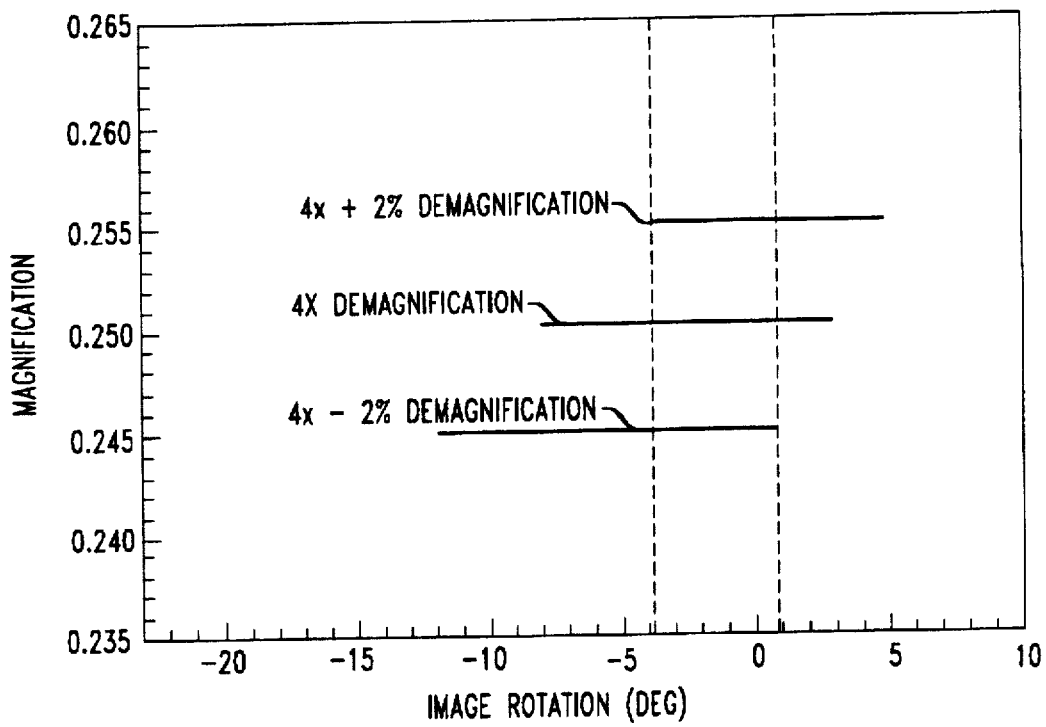
FIG. 6 illustrates the rotation provided by coil assembly when operated as described in FIG. 5.

As indicated in FIG. 6, the amount of ration that one can obtain and keep the amount of magnification or demagnification constant is finite. However, this finite range varies depending upon the coil configuration and the position of the coil assembly in the tool. For example, if the change in the amount of magnification/demagnification allowed by the process specifications is ±2%, the amount of rotation that can be obtained to maintain the magnification or demagnification within this range is defined by the vertical dashed lines (about 4.5°). Therefore, before selecting a particular coil configuration and a particular coil placement, it is advantageous to know the process requirements (i.e., what range of beam rotation or change in magnification/demagnification will the coil assembly be required to perform; what amount of variation in these parameters can be tolerated by the process). One can then use standard modeling tools such as those previously described to determine the size and placement of the coils required to obtain the desired amount of rotation or magnification/demagnification. Once the coil assembly is placed in the tool, the tool is calibrated as described above.

Figure 7:
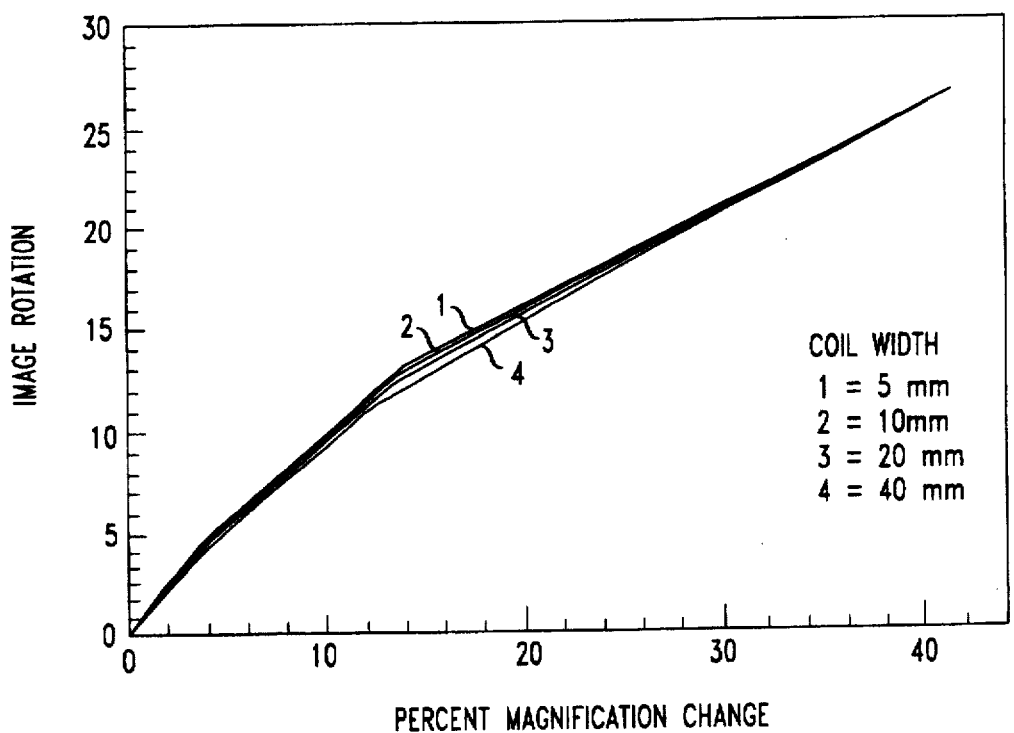
FIG. 7 illustrates the effect of coil width on the relationship between image rotation and magnification.

The effect of coil configuration on image rotation is illustrated in FIG. 7. As illustrated in FIG. 7, using the modeling techniques previously described, image rotation varies with percent change in magnification for coils with varying widths. The relationship between image rotation and percent magnification was not significantly affected by coil width (widths used were 5 mm, 10 mm, 20 mm and 40 mm). The coil height was 24 mm and the coil bore was 100 mm.

Figure 8:
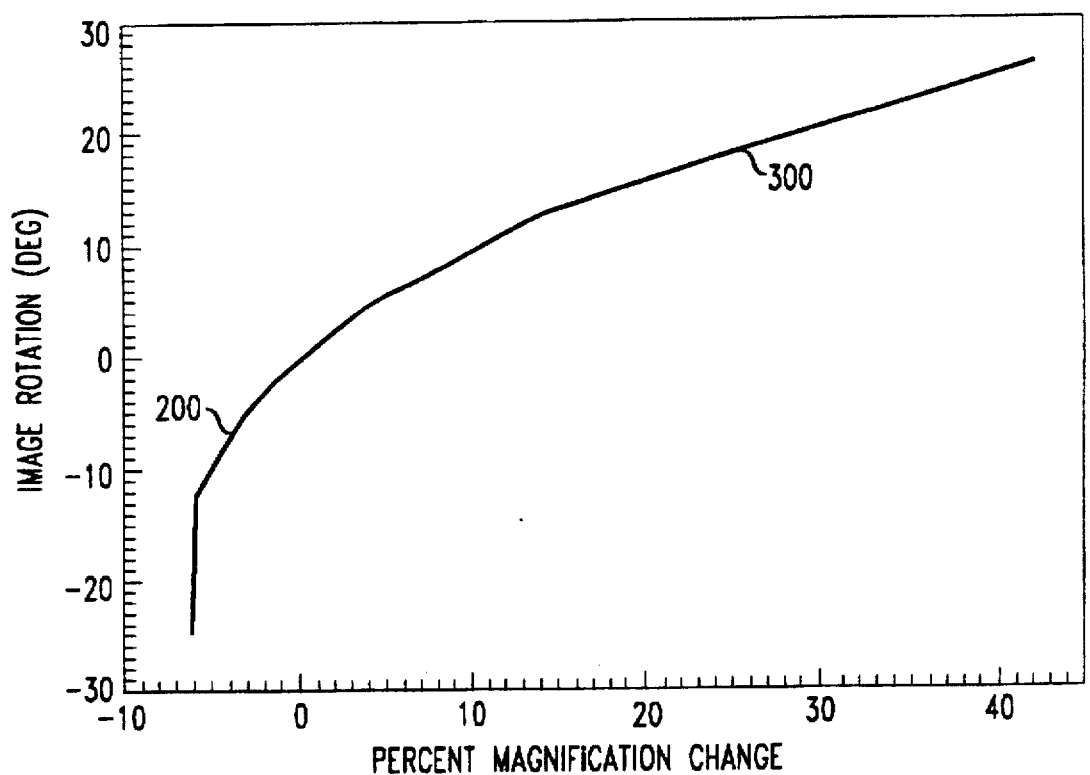
FIG. 8 illustrates the relationship between image rotation and magnification for a single coil with a coil bore of 100 mm, a coil width of 5 mm, and a coil height of 24 mm.

As illustrated by FIG. 8 for a coil with a bore of 100 mm, a coil width of 5 mm and a coil height of 24 mm, the relationship between image rotation and image magnification by a single coil is such that, at segment 200 on the curve there is a lot of change in rotation and very little change in magnification, and at segment 300 in the curve there is more change in magnification than there is in rotation. Therefore, in one embodiment of the present invention one coil is operated in the range where a change in rotation is accompanied by very little change in magnification and the other coil is operated in the range where there is more change in magnification than there is in rotation. This provides an assembly in which the desired amount of rotation of the particle beam is primarily provided by one coil in the assembly and the desired amount of magnification or demagnification is provided by the other coil in the coil assembly.

Once the coils are calibrated as described above, a controller is then provided with the information regarding the relationship between each coil and the rotation and magnification of the image. The charged particle beam apparatus is then operated as discussed above. If the detection mechanism in the apparatus detects, from the alignment marks on the surface of the wafer, that the image must be rotated x degrees, the apparatus provides this information to the controller. The controller then determines, from the calibration information obtained as described above, how much current to provide to the individual coils in the coil assembly to accomplish the desired image rotation, without magnifying or demagnifying the image more than the mount either desired or permitted based on process constraints.

The invention claimed is:

1. A charged particle beam lithography process for semiconductor device fabrication comprising the steps of:

shaping a charged particle beam by passing the charged particle beam through an aperture;

projecting the charged particle beam through a coil assembly comprising at least two coils and onto a substrate having at least one alignment mark;

detecting a position of the substrate and thereby determining a rotation angle of the substrate position relative to a desired substrate position;

determining an amount of current to be provided to each coil in the coil assembly to rotate the charged particle beam a desired amount and to introduce a desired lens effect in the charged particle beam;

providing that amount of current to each coil, thereby introducing the desired rotation and the desired lens effect into the charged particle beam; and projecting the charged particle beam onto the substrate.

2. The process of claim 1 wherein the charged particle beam is an electron beam.

3. The process of claim 1 wherein the coil assembly comprises two solenoid coils and wherein a configuration of the first coil of the two solenoid coils is different from a configuration of a second coil of the two solenoid coils.

4. The process of claim 3 wherein the two coils have a cylindrical configuration and wherein an outer diameter of one coil is sufficiently smaller than an inner diameter of the second coil such that the smaller diameter coil is placed within the large diameter coil.

5. The process of claim 1 wherein the lens effect is a change in a magnification of an image in the charged particle beam.

6. The process of claim 1 wherein the coil assembly comprises at least two solenoid coils.

7. The process of claim 1 wherein the coil assembly comprises at least two lenses.

8. The process of claim 1 wherein the coil assembly comprises at least one solenoid coil and at least one lens.

9. A charged particle beam apparatus comprising:
a charged particle beam generator for generating a charged particle beam;
a shaping aperture positioned downstream from the charged particle beam generator;
a mechanism for focusing the charmed particle beam into a plane;
a coil assembly comprising at least two coils interposed between the shaping aperture and the plane in which the charged particle beam is focused; a detector which detects a rotation angle of a substrate positioned in the apparatus relative to a desired position of the substrate in the apparatus; and a controller that determines an amount of current to provide to the individual coils in the coil assembly to rotate the charged particle beam in a direction of the rotation angle and to introduce a lens effect into the charged particle beam, wherein the coils in the coil assembly receive a current from a current source that is controlled by the controller and wherein the controller determines the amount of current to provide to the individual coils in the coil assembly to magnify or demagnify an image in the charged particle beam to a predetermined amount while controlling a degree to which the charged particle beam is rotated as a result of the magnification or demagnification.

10. The apparatus of claim 9 wherein the shaping aperture is a mask.

11. The apparatus of claim 10 wherein the mask is a stencil mask.

12. The apparatus of claim 10 wherein the mask is a scattering nonscattering mask.

13. The apparatus of claim 10 wherein the mechanism for focusing the charged particle beam into a plane is a lens and further comprising a back focal plane filter positioned in a back focal plane of the mask.

14. The apparatus of claim 9 wherein the coil assembly comprises at least two solenoid coils.

15. The apparatus of claim 9 wherein the coil assembly comprises at least two lenses.

16. The apparatus of claim 9 wherein the coil assembly comprises at least one solenoid coil and at least one lens.

* * * * *